United States Patent [19]

Soclof

[11] Patent Number: 5,025,302
[45] Date of Patent: Jun. 18, 1991

[54] PNP TYPE LATERAL TRANSISTOR WITH MINIMAL SUBSTRATE OPERATION INTERFERENCE

[75] Inventor: Sidney I. Soclof, San Gabriel, Calif.

[73] Assignee: Rockwell International Corporation, El Segundo, Calif.

[21] Appl. No.: 62,754

[22] Filed: Jun. 16, 1987

Related U.S. Application Data

[63] Continuation-in-part of Ser. No. 279,482, Jul. 1, 1981, abandoned.

[51] Int. Cl.$^5$ .................... H01L 29/72; H01L 29/06
[52] U.S. Cl. ........................................ 357/55; 357/35
[58] Field of Search ..................... 357/23.5, 35, 55

[56] References Cited

U.S. PATENT DOCUMENTS 4,519,849 5/1985 Korsh et al. .
4,641,170 2/1987 Ogura et al. .

OTHER PUBLICATIONS

S. A. Evans et al., "A 1-Micron Bipolar VLSI Technology", *IEEE Transactions on Electron Devices*, vol. ED-27 (Aug. 1980), pp. 1373-1379.

*Primary Examiner*—J. Carroll
*Attorney, Agent, or Firm*—H. Fredrick Hamann; George A. Montanye; Wilfred G. Caldwell

[57] ABSTRACT

The invention provides a unique sub-micron dimensioned PNP-type transistor wherein hundreds of such transistors may be fabricated on a single chip with each transistor comprising an active region surrounded by field oxide completely isolating it from the substrate and its effects on operation. Slots made in the substrate permit angle evaporation of etch-resist to protect the active region while it is disconnected from the substrate by etching therebeneath via the slots. Substrate oxidation supports the active regions while orthogonal slots are provided permitting access to opposed sides of the active regions for doping N+ which is driven in from one side only while P or P+ is introduced and driven in from both sides, thereby providing a P+ N+N, P+ emitter, base, collector transistor active region to which electrical connections are applied using conventional techniques, providing almost complete reduction of the parasitic capacitances and resistances because of the total oxide isolation of the active regions from the substrate.

5 Claims, 13 Drawing Sheets

PNP TYPE LATERAL TRANSISTOR WITH MINIMAL SUBSTRATE OPERATION INTERFERENCE

CROSS REFERENCE

This application is a continuation-in-part of Ser. No. 06/279,482 filed July 1, 1981, now abandoned by the same inventor

FIELD OF THE INVENTION

This invention is a novel structure and method for forming a sub-micron PNP type lateral dielectrically isolated transistor utilizing VLSI chip processing steps to fabricate hundreds of such devices simultaneously.

BACKGROUND OF THE INVENTION

Techniques extracted from the prior art come from the field of sub-micron fabrication technology wherein the dimensional resolution is now comparable to or even smaller than the thicknesses of the thermally grown silicon oxide layers on silicon. Also the dimensions are now comparable to or even smaller than the base widths used for double diffused transistors, i.e., 0.4–1.0 micrometers. From these techniques, the novel structure and method for the PNP lateral transistor with greatly reduced parasitic capacitance and resistances is achieved.

SUMMARY OF THE INVENTION

The invention is a novel lateral PNP type transistor formed on a substrate by orthogonal slots which define each active region and permit doping of the active regions via opposed slots while supported by oxidation achieved through underlying etching of each active region in a semi-array of regions supported at spaced apart positions and totally isolated from the substrate by substrate oxidation. Electrical connections may be conventionally made to the P emitter, N+N graded base and P collector.

BRIEF DESCRIPTION OF THE DRAWINGS

An alternate method of forming contacts is set forth in the following figures.

A further alternate embodiment for making submicron contacts is shown in FIGS. 31–45.

DETAILED DESCRIPTION OF A PREFERRED EMBODIMENT

In the device produced in accordance with the present invention, the effects of the substrate are minimized relative to the operation of the device. It should be realized that the active region may be completely contained within the substrate with a surface area of $3d \times 5d$ or $15d^2$ wherein d is only 0.4 micrometers. The isolated region is completely separated from the substrate by oxidation and the parasitic capacitances and resistances are almost completely reduced to a minimum value attainable because the transistor is reduced essentially to just its electronically active region whereas in the conventional (vertical) transistor, the electrically active region is only a very small fraction of the total transistor area. The dielectric isolation between transistors offered by the same substrate oxidation has advantages with respect to high frequency performance, high voltage integrated circuits, radiation resistance, circuit flexibility, i.e., the process can provide NPN, PNP, JFET, MOSFET's etc. on the same integrated circuit chip.

Figure 1:
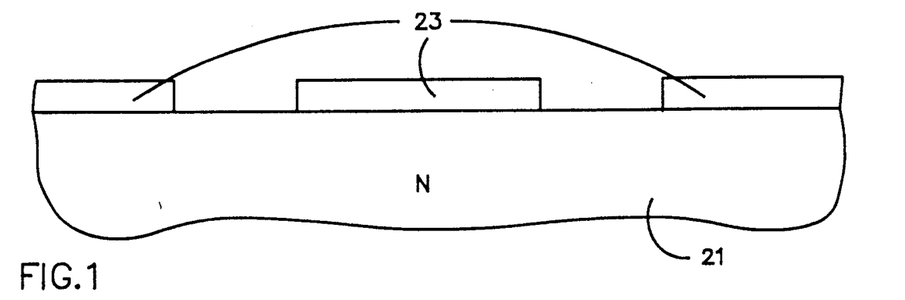
FIG. 1 is a view in section through an N type substrate with photoresist applied through a slotted mask.
Figure 2:
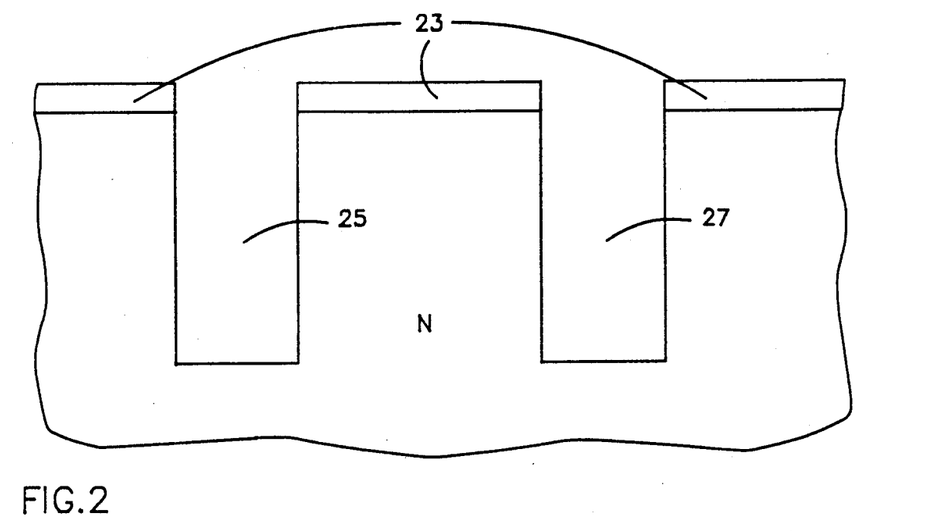
FIG. 2 shows the structure of FIG. 1 with slots formed in the substrate where not protected by the resist.

In FIG. 1, there is shown a silicon substrate of the N type, having patterned photoresist applied to an upper preferably, 100 surface thereof. The pattern may simply comprise longitudinal slots for rendering the photoresist 23 alternately soluble and it may be seen that the soluble photoresist has been removed to provide exposure of the substrate 21 so that the slots 25 and 27 (FIG. 2) may be milled therein or formed by O.D.E. etching process. These slots 25 and 27 penetrate the upper surface of the silicon substrate 21 sufficiently deeply that they extend beneath the depth of the region which will ultimately become the active regions for the various transistors.

Figure 3:
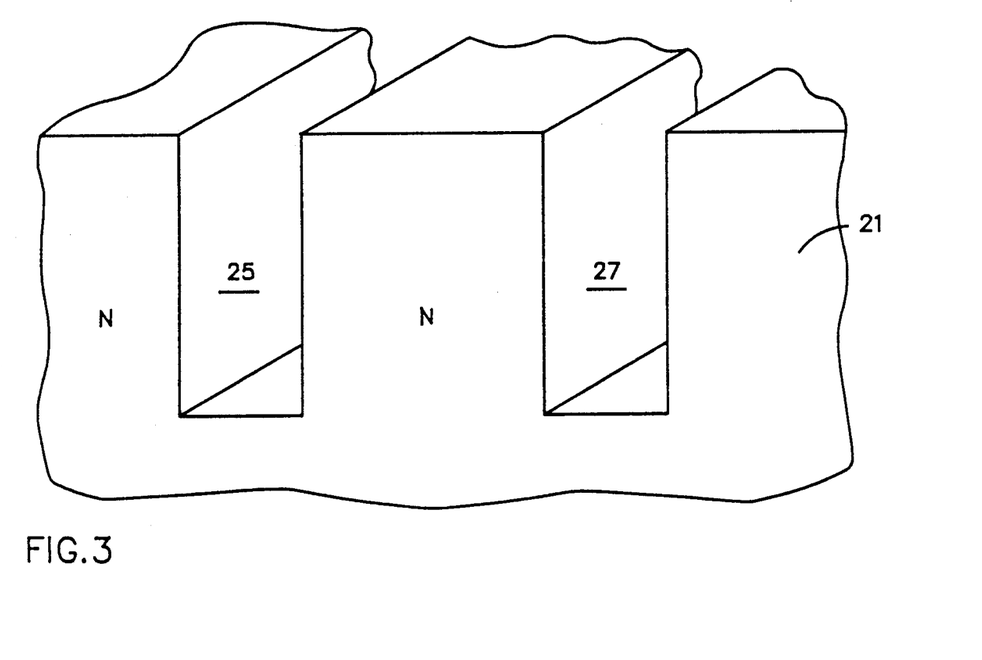
FIG. 3 is a perspective view of the substrate showing the first set of longitudinal slots.

In FIG. 3, the photoresist layer 23 has been removed and the structure is shown in perspective thereby showing the slots 25 and 27 extending inwardly of the upper surface of silicon substrate 21.

Figure 4:
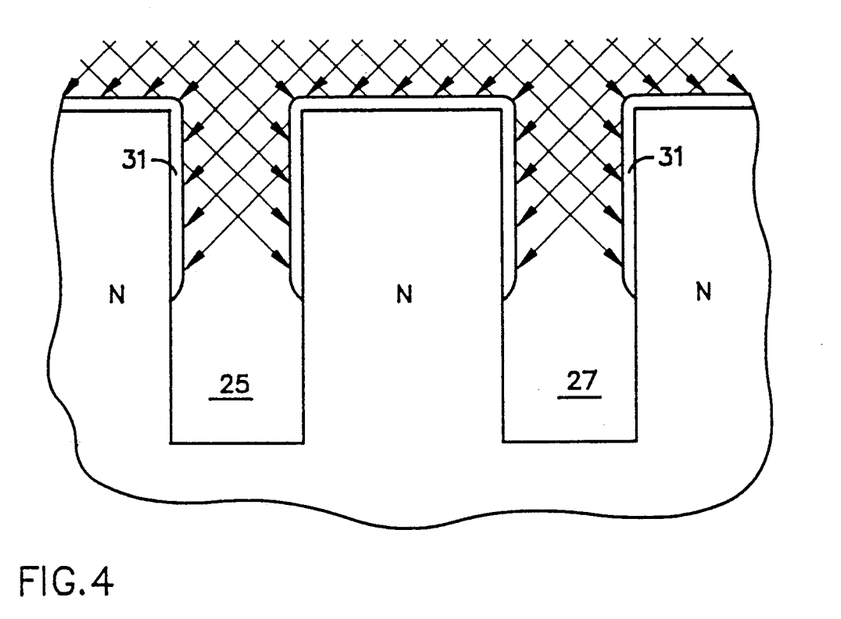
FIG. 4 is a view in section showing the application of an angle evaporation etch resist layer partially protecting the edges of the slots.

In FIG. 4, it may be appreciated why the slots 25 and 27 are necessary. They permit angle evaporation of etch-resist 31 to the edges of the slots 25 and 27. The result provides a protective covering over the tops of the active regions being formed. Also, it should be noted that due to the angle of evaporation of the etch resist 31, this protective layer only extends to a certain depth within slots 25 and 27, but this depth must be adequate to protect the active regions being formed. Thus, in FIG. 5, it may be seen that the active regions are generally shown at 35, 37 and 39 above the silicon substrate etch level 41 and also above the etch levels 35', 37' and 39' where the etch introduced through the slots 25 and 27 removed the substrate from beneath the active regions 35, 37 and 39.

Figure 5:
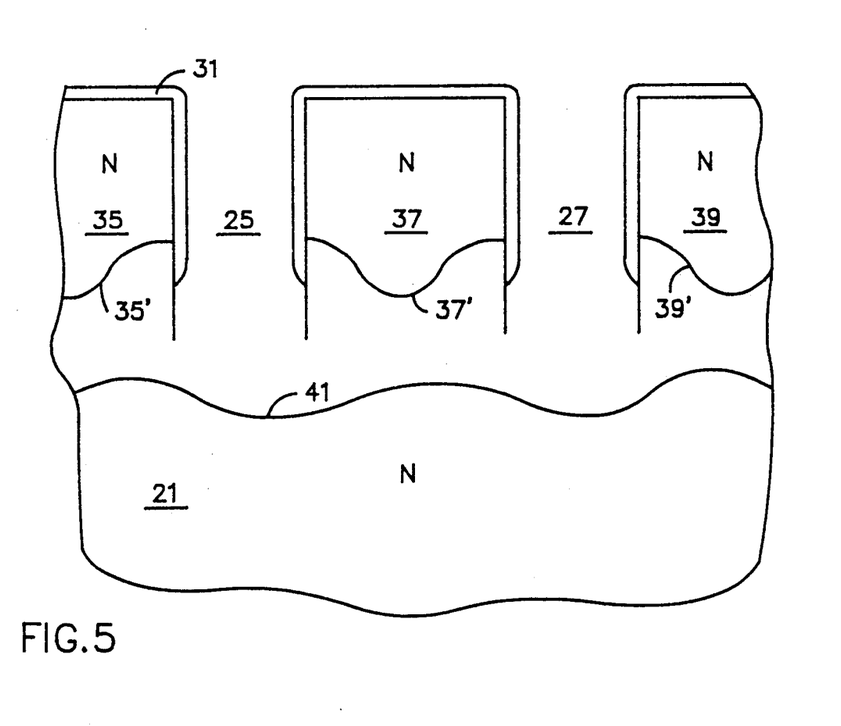
FIG. 5 is a view in section with the etch resist layer in place and showing the effects of the etch having been applied via the slots to undercut the longitudinal regions which will become active regions of the transistors being formed.

Actually, there are a plurality of active regions aligned in the remaining portions 35, 37 and 39 which represent semi-arrays of transistors being formed. Obviously, the semi-arrays are supported at their ends or spaced apart positions so that the active regions do not collapse into the substrate etched space above level 41

Figure 6:
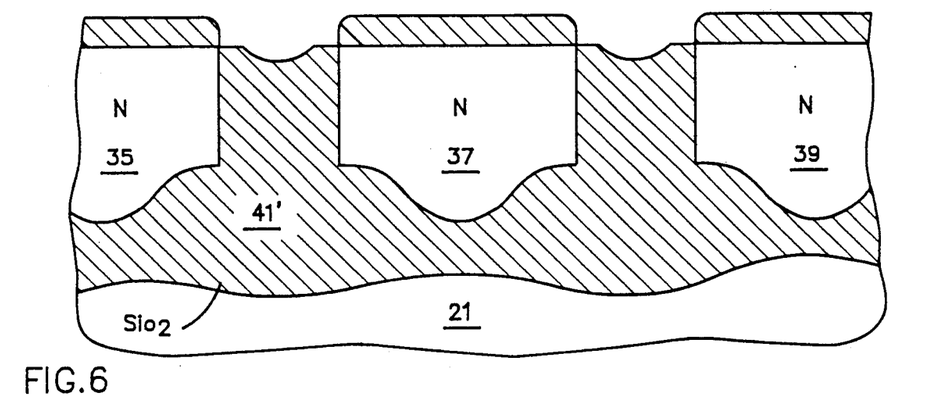
FIG. 6 shows the structure of FIG. 5 after the etch resist has been removed and following oxidation of the substrate to fill in the voids created by the etch.
Figure 7:
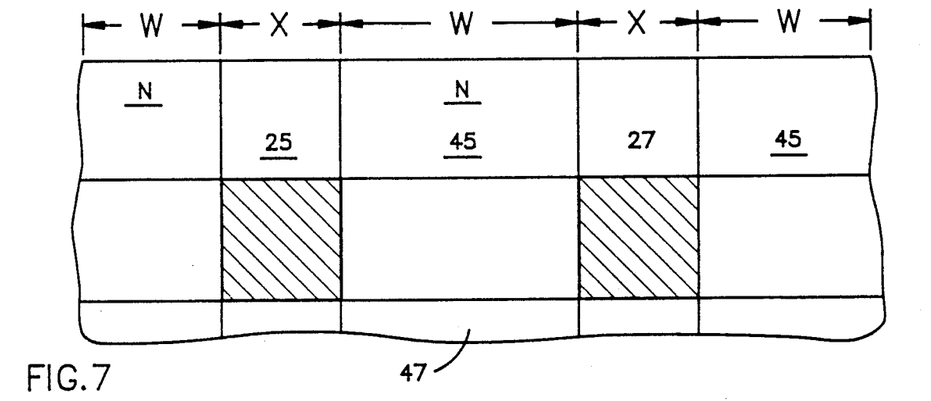
FIG. 7 is a view in plan of the structure of FIG. 6 showing the orthogonal set of slots relative to the original set of slots.

In FIG. 6, it may be seen that the etch resist 31 has been removed and the silicon has been oxidized to $SiO_2$ shown at 41' as filling or partly filling the voids between regions 35, 37 and 39 and the silicon substrate 21. Thus, with the regions supported now by the silicon oxide 41', the orthogonally related sets of slots 45 and 47 may be formed as illustrated in the top plan view of FIG. 7. The procedure for forming these slots is the same as before, requiring a photoresist layer patterned in the form of spaced apart slots and the silicon material either ion milled away or etched using O.D.E.. techniques, as best shown in FIG. 8.

Figure 8:
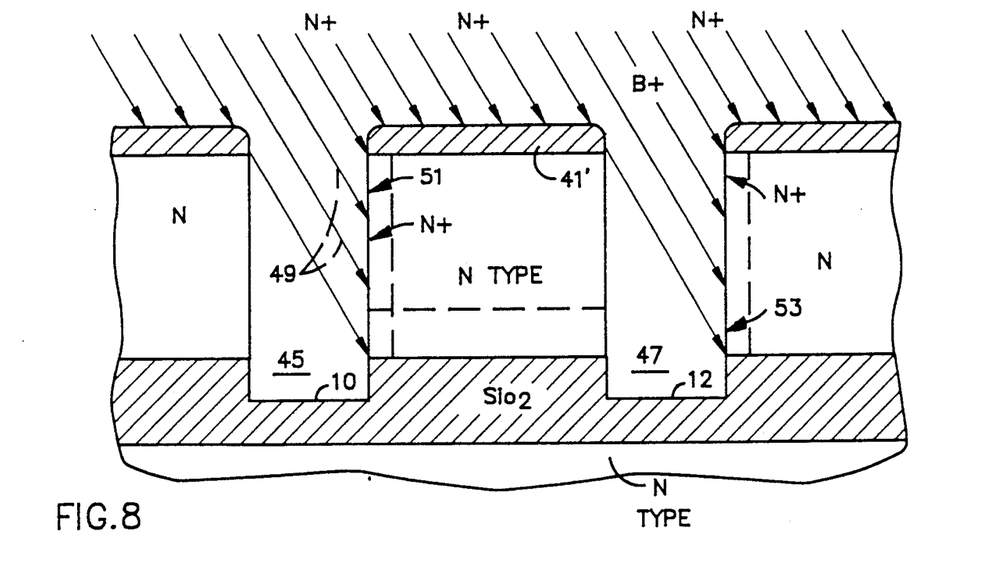
FIG. 8 is a view in section, taken across the orthogonal set of slots, showing the phosphorus ion implant step to produce the N+ doping shown.

In FIG. 8, the application of N+ doping is achieved by phosphorus implant, shown by the arrows 49, to produce the N+ region 51. It should be noted that this implanting is done only into the corresponding right hand edges of slots 45 and 47 to provide the N+ layers 51 and 53.

Figure 9:
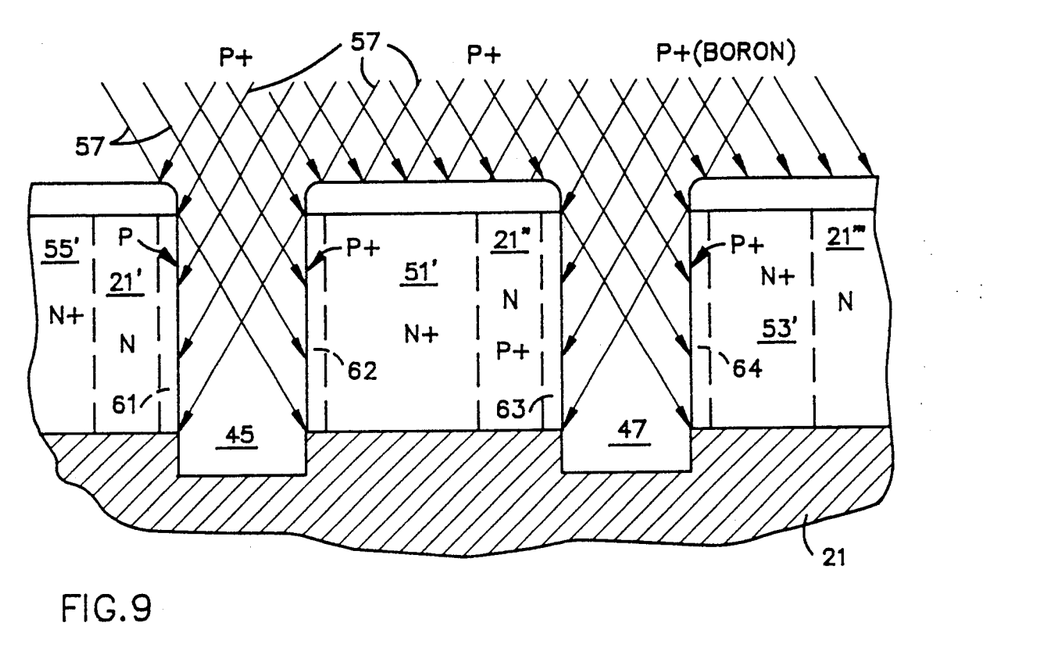
FIG. 9 shows the structure of FIG. 8 taken after phosphorus drive-in and the application of boron deposit or implant.

In FIG. 9, it may be seen that the N+ regions have been driven in, such as by using high heat, so that they are expanded as shown by 51' and 53'. Also, a further N+ region is visible to the left at 55', having been produced by a slot to the left of the margin of the page.

Next, in FIG. 9, it will be seen that boron is implanted (or deposited) into both edges of each slot, as shown by the arrows 57, to provide the P or P+ regions 61, 62, 63 and 64. It may also be pointed out that the N regions 21', 21'' and 21''' are the remaining regions from the original N type silicon substrate.

Figure 10:
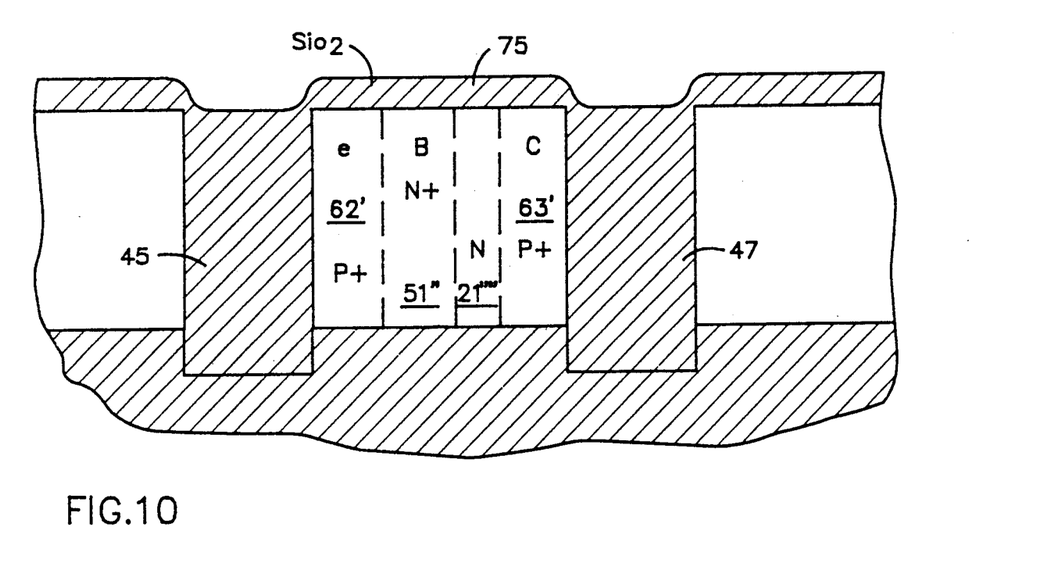
FIG. 10 shows the structure of FIG. 9 following boron drive-in from both sides to produce the P+ regions and following oxidation of the substrate to fill the slots and protect the top.

Proceeding from FIG. 9 to FIG. 10, it may be seen that the boron P or P+ regions 62 and 63 have now been driven in to comprise the expanded regions 62' and 63'. Accordingly, the N+ region has been changed in size and is now designated 51'' as is also true of the remaining N region, now identified as 21''''. The region 62' will comprise the emitter with the regions 51'' and 21'''' comprising a graded base region, and finally region 63', being the collector region.

Also, in FIG. 10 it may be seen that the substrate has again been oxidized to fill in the slots 45 and 47 and provide a covering over the active region of the electrodes generally shown at 75. The doping gradient in the base region is similar to conventional double diffused transistors.

Figure 11:
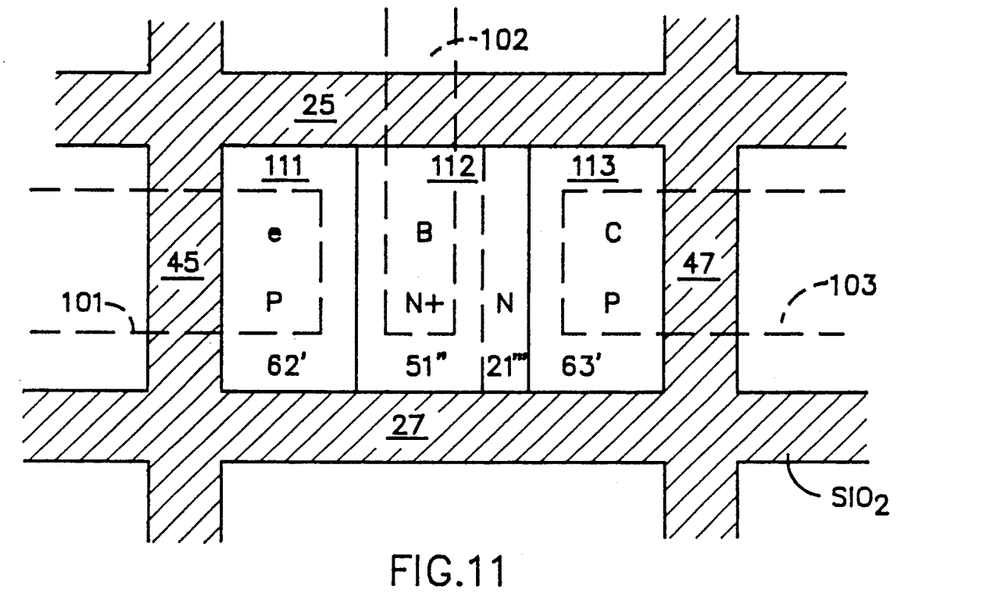
FIG. 11 is a top plan view of the completed structure showing in dashed outline the electrode connections for the emitter, base and collector for a single active region of a single transistor.

A finished transistor is shown in FIG. 11 wherein the contacts 101, 102 and 103 are provided from a metallization layer for the emitter 111, base 112 and collector 113, respectively. These contacts are fabricated simply by conventional techniques for patterning or metallization.

It may be seen that the transistor comprising these three electrodes is surrounded by moats of silicon oxide formed in the slots 25, 27 and 45, 47. Thus, the transistor is isolated from its substrate, adjacent transistors or other elements.

Figure 12:
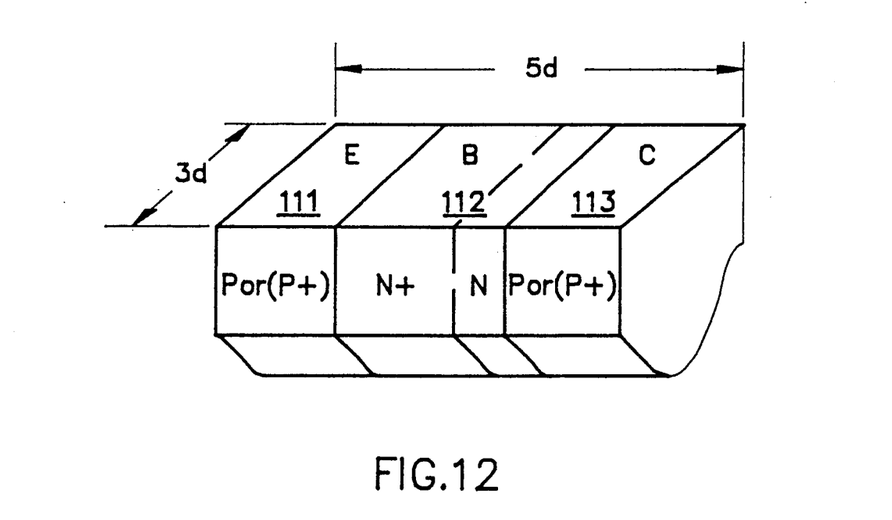
FIG. 12 is a view in perspective of the transistor active region, per se.
Figure 13:
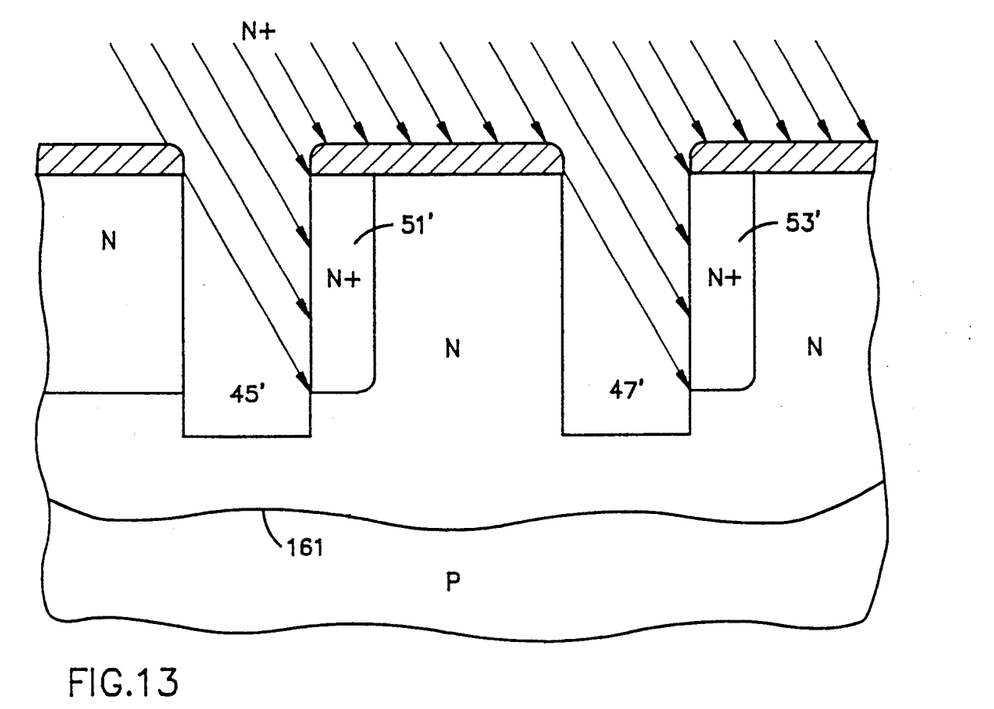
FIG. 13 shows an alternate embodiment using substrate doping change in lieu of oxide for device isolation.

The active region of the transistor is visible in FIG. 12, in the perspective view, showing the emitter 111 base 112 and collector 113.

Figure 14:
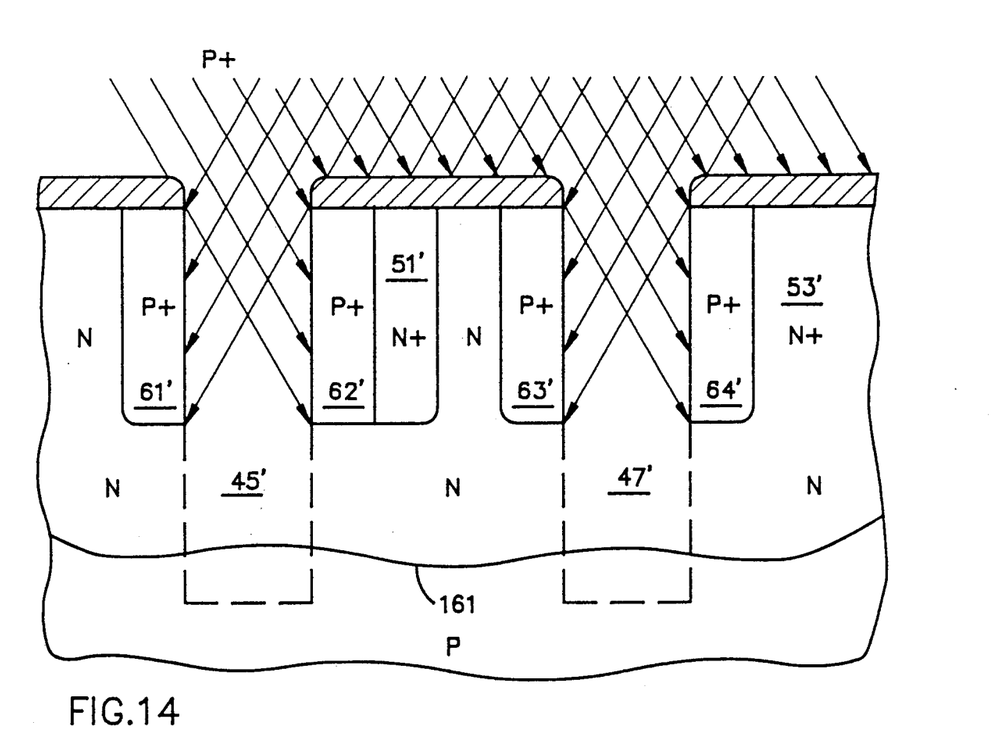
FIG. 14 shows steps employed in the alternate embodiment process of FIG. 13.

If it is desired to use doping opposite that of the substrate beneath the active region as further isolation, a P substrate can be doped N in the active regions, as in a well or layer, and the use of O.D.E. avoided by skipping from FIG. 3 to FIG. 13. Next, active regions 51', 53' are doped N+ (see FIG. 13) via the slots 45' and 47' using phosphorus or arsenic ion angle implanted so only regions 51', 53' become N+ doped. Then, boron is implanted from all edges of slots 45' and 47' (FIG. 14) to form P+ regions 61', 62', 63' and 64'. Thereafter, the slots 45' and 47' are deepened into the original P substrate and filled with oxide. Thus, each active region is P+N+N and P+ doped in an N doped well or layer but is underlaid by P doped substrate for total isolation without using etching techniques.

Contacts are established to each emitter, base and collector by metallization techniques.

The following method of making extremely small contacts is an alternative method. It is applied to an NPN lateral bipolar transistor for illustrating versatility, but the principles apply equally to PNP, and the changes are set forth hereinafter.

Figure 15:
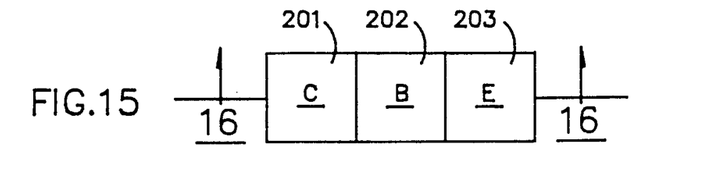
FIG. 15 is a view in top plan of a bipolar device.

In FIG. 15, the collector, base and emitter 201, 202 and 203 are depicted in a lateral arrangement as seen in top plan.

Figure 16:
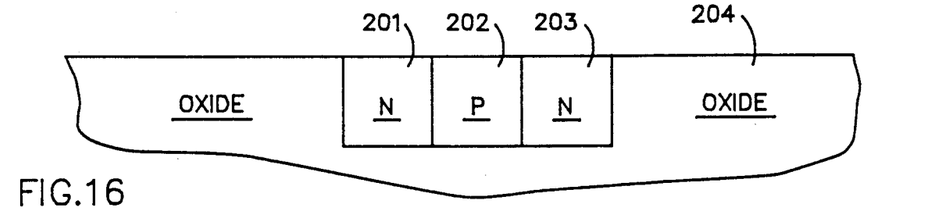
FIG. 16 shows the device of FIG. 15 in cross-section in field oxide.

In FIG. 16, the collector 201 is shown as being N doped, the base 202 P doped and the emitter 203 N doped, all surrounded by oxide.

Figures 23, 24:
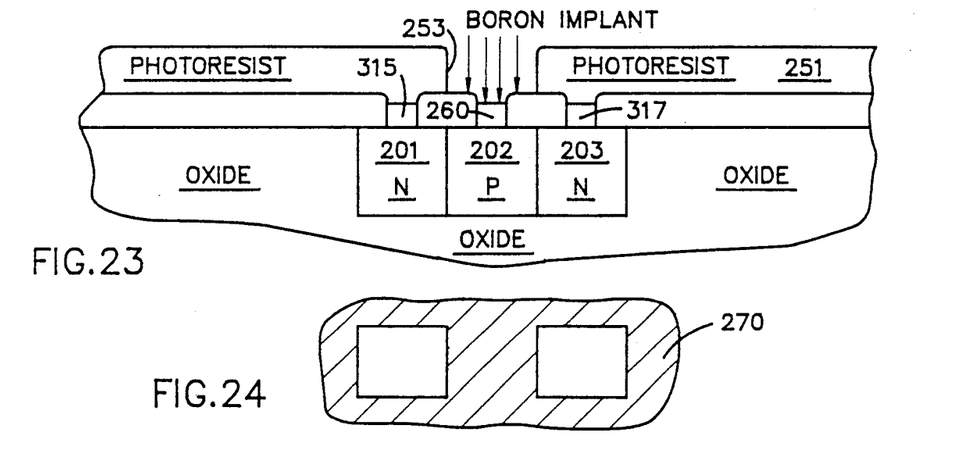
FIG. 23 shows the boron implant to achieve the doping of the polysilicon electrode.
FIG. 24 shows a mask for opening regions to the collector and emitter (N regions)

The first step in building very sub-micron contacts (i.e., 0.1 micron by 0.1 micron) for these devices is to deposit undoped polysilicon to approximately 5000 angstroms. This layer is shown at 205. This step may be applied to the structure of FIG. 10, once the upper oxide is removed. Only the doping for the substrate and the steps of FIGS. 23 and 25 would be switched for the PNP device. The graded base 112 (FIG. 12) is a single N doped electrode and presents no problem in this alternate method.

Figure 17:
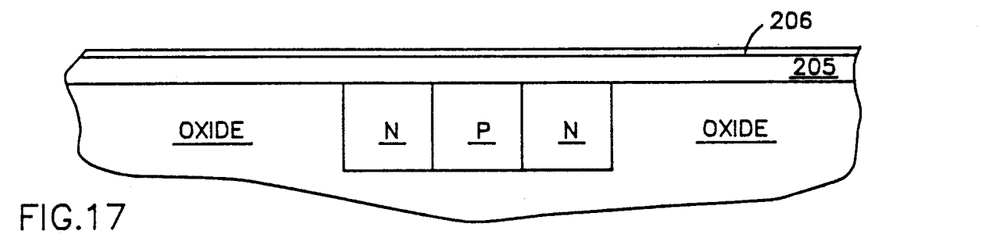
FIG. 17 shows the application of a polysilicon layer covered by a nitride layer to the structure of FIG. 16.

Returning to FIG. 17, a layer 206 of nitride is deposited to a thickness of approximately 1000 angstroms over layer 205.

Figure 18:
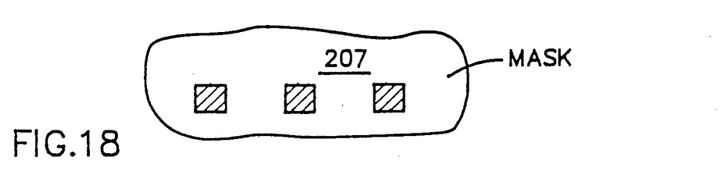
FIG. 18 shows a contact mask.
Figure 19:
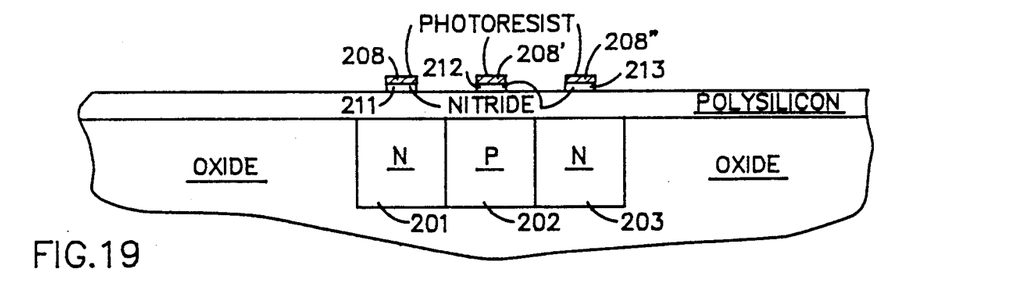
FIG. 19 shows the nitride buttons remaining over each of the bipolar elements atop the polysilicon layer.

The mask 207 of FIG. 18 is employed with photoresist (not shown) to delineate the nitride 206, thereby leaving the nitride buttons 211, 212 and 213 over the collector 201, base 202 and emitter 203, respectively (as shown in FIG. 19).

Figure 20:
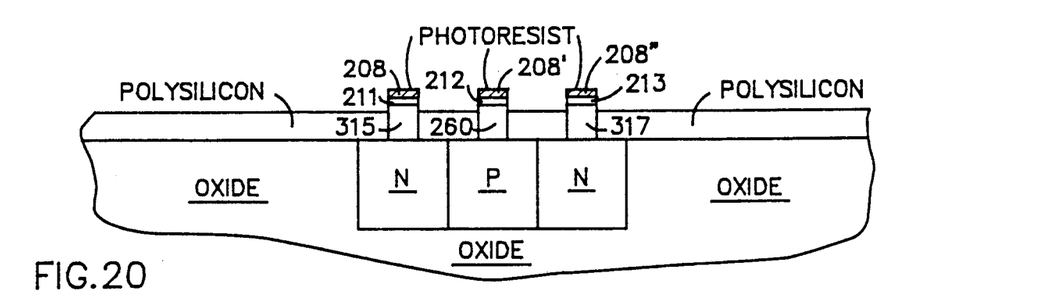
FIG. 20 shows a portion of the polysilicon layer removed.

To insure ultimate planarization, a portion of the polysilicon is etch removed (FIG. 20). This may comprise 2500 angstroms of polysilicon. A non-selective or anisotropic etch is employed so that only the polysilicon is removed.

Figure 21:
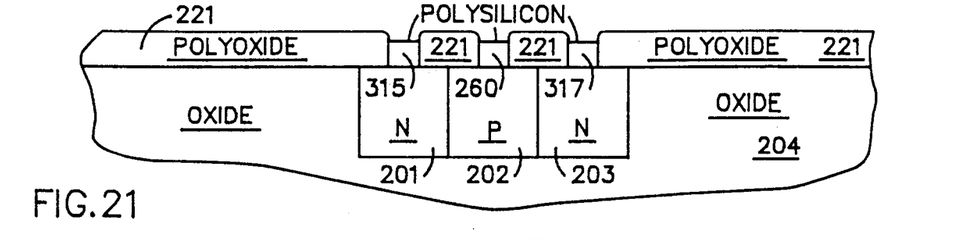
FIG. 21 shows the polysilicon layer converted to polyoxide except where the nitride buttons preserve the polysilicon.

Next, the resist is stripped and the polysilicon oxidized to become polyoxide 221 shown in FIG. 21. The polyoxide 221 also fills in the spaces between the nitride buttons 211, 212 and 213 and rises slightly above the nitride to insulate the contacts from each other.

FIG. 21 also shows the structure after the nitride buttons 211, 212 and 213 have been removed by etching or stripping.

Figure 22:
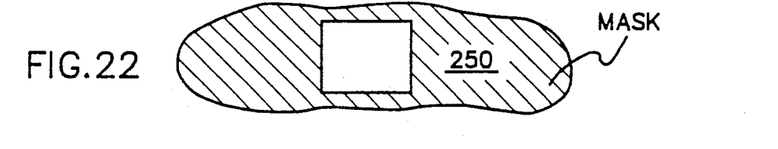
FIG. 22 shows the mask for activating the base electrode polysilicon.

In FIG. 22, mask 250 is used, together with photoresist 251 (FIG. 23), to open aperture 253 into the P doped base 202. For boron implanting into the base electrode 260 to make contact to base 202, implanting is carried out using a 60 Kev implanter with a 1 to $5 \times 10^{15}$ ions per cm$^2$ dose. (See FIG. 23.)

Figure 25:
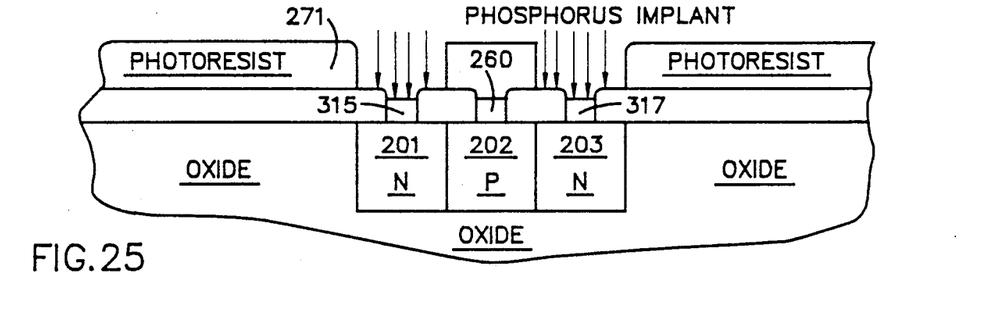
FIG. 25 shows these regions opened and the polysilicon therein being doped by phosphorus implant.

Next, the photoresist 251 is stripped and a new layer applied for use with the mask 270 (FIG. 24) to open the new layer of photoresist 271 above the collector 201, and emitter 203. The phosphorus ions are implanted, the photoresist 271 is stripped and the device of FIG. 25 is annealed for the implants at 800° C. for 40 minutes in a nitrogen atmosphere.

Figure 26:
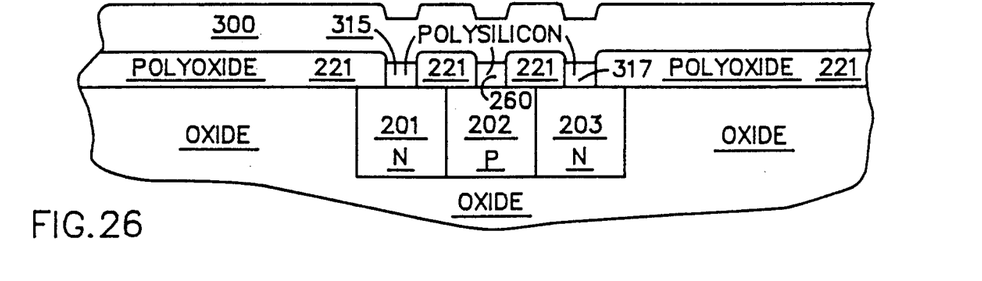
FIG. 26 shows a layer of metal over top of the structure.
Figure 27:
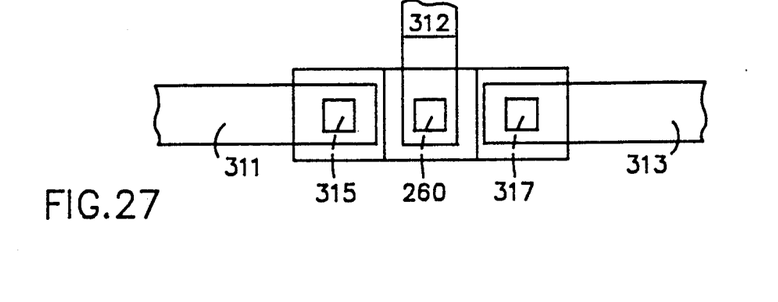
FIG. 27 shows the arrangement in top plan view as delineated by the mask of FIG. 28.
Figure 28:
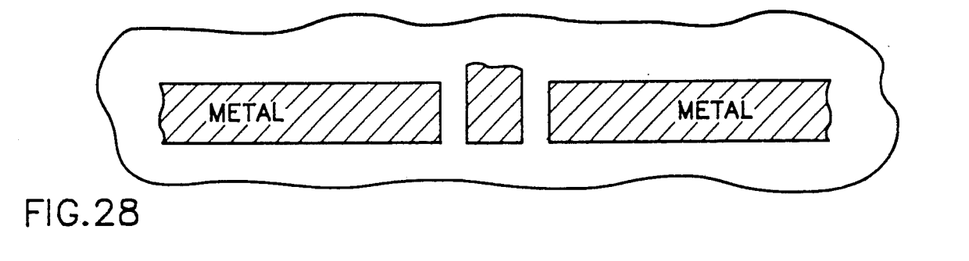

In FIG. 26, a metal layer 300 has been applied over the structure, photoresist and the metal mask of FIG. 28 are applied, and the metal is etched to provide a metal interconnect 311 (FIG. 27) to the doped poly electrode 315 of collector 201, interconnect 312 to the doped poly electrode 260 of base 202 and interconnect 313 to the doped poly electrode 317 of emitter 203.

Figure 29:
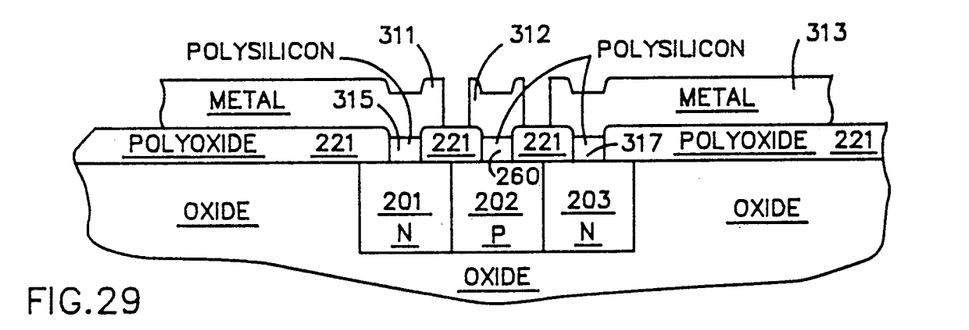
FIG. 29 shows the completed device following sintering.

FIG. 29 shows a completed device.

Figure 30:
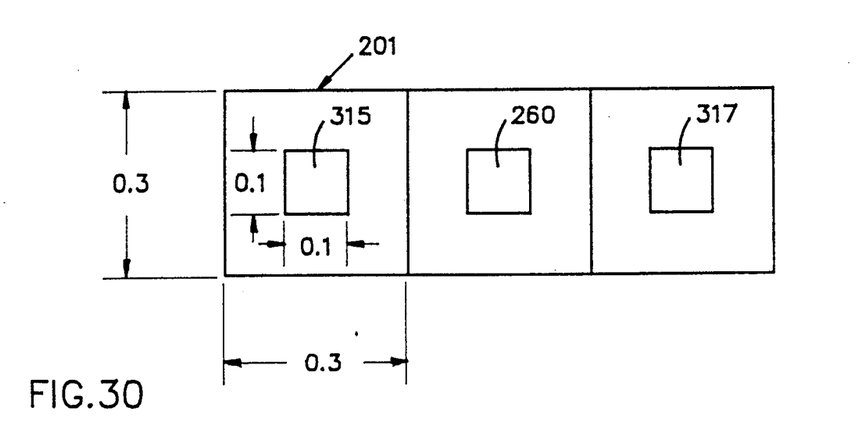
FIG. 30 shows relative sizes for the bipolar device, the elements themselves, such as the collector measuring 0.3 by 0.3 microns and the contact regions measuring 0.1 by 0.1 microns.

FIG. 30 shows relative sizes for the bipolar device, the elements themselves, such as the collector measuring 0.3 by 0.3 microns and the contact regions measuring 0.1 by 0.1 microns.

Figure 31:
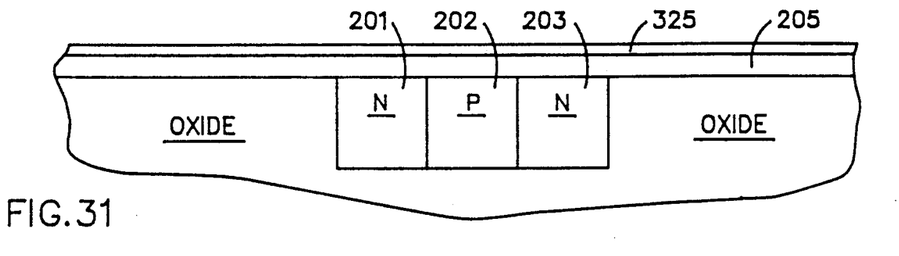
FIG. 31 depicts the transistor elements under a layer of polysilicon covered by nitride.
Figure 32:
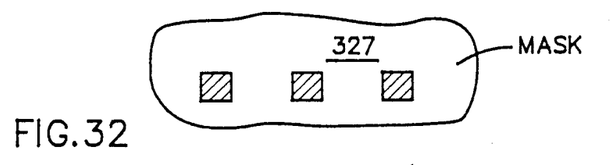
FIG. 32 shows a nitride button mask.
Figure 33:
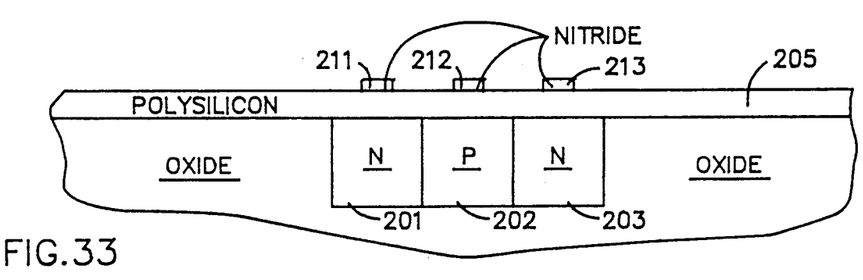
FIG. 33 depicts the isolated nitride buttons over contact regions.

Yet another alternative method for forming the contacts is disclosed, beginning with FIG. 31 wherein the three elements collector 201, base 202 and emitter 203 are first covered by polysilicon 205 to a depth of, e.g., approximately 3000 angstroms, and nitride 325 is deposited to a depth of, e.g., approximately 1000 angstroms. Mask 327 serves to form the nitride buttons 211, 212 and 213 (the same as before). These nitride buttons 211–213 are preferably centered over the collector 201, base 202 and emitter 203 as seen in FIG. 33, although considerable leeway is available for any misalignment, as is apparent from FIG. 45.

Figure 34:
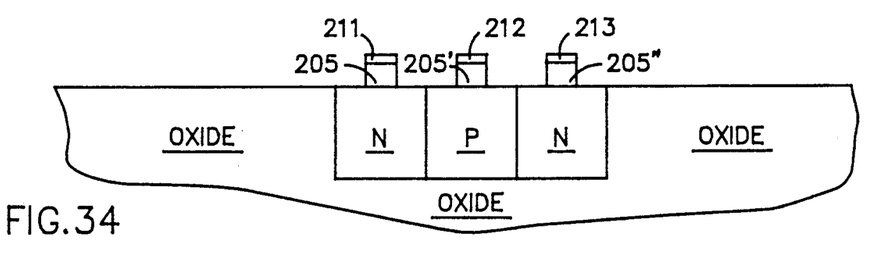
FIG. 34 shows etching away of part of the polysilicon.

In FIG. 34, the unprotected polysilicon 205 is removed in conventional manner, such as by etching to leave undoped polysilicon contacts 205, 205', and 205".

Figure 35:
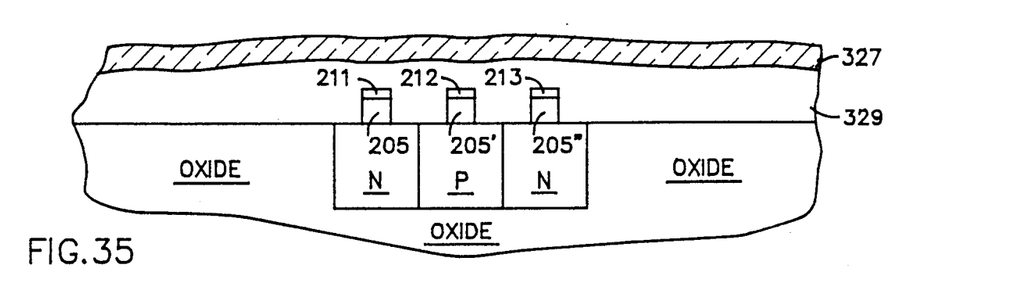
FIG. 35 reveals the plasma oxide covering the contacts, and in turn covered by glass (SOG)

In FIG. 35, plasma oxide 329 is deposited using the conventional planarization process to a depth of approximately 3000 angstroms. This step is followed by spinning on glass 327 (SOG) so as to look substantially planar.

Figure 36:
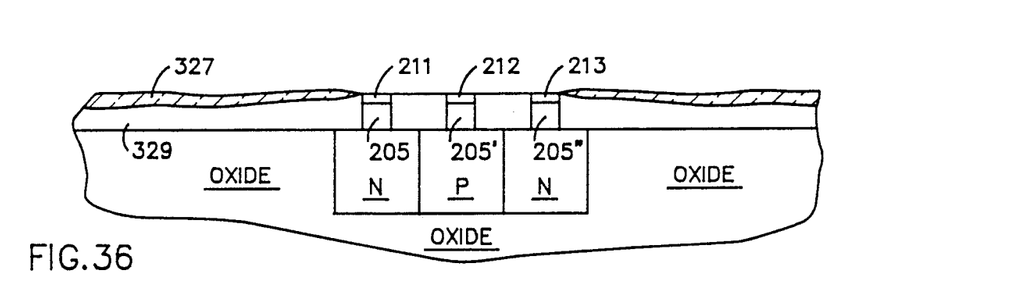
FIG. 36 planarizes the structure of FIG. 35 down to the tops of the nitride buttons.

In FIG. 36, a reactive ion etching (RIE) conventional step is carried out for effecting planarization which exposes the nitride buttons 211, 212 and 213 and is terminated approximately at the level of the tops of these buttons.

Figure 37:
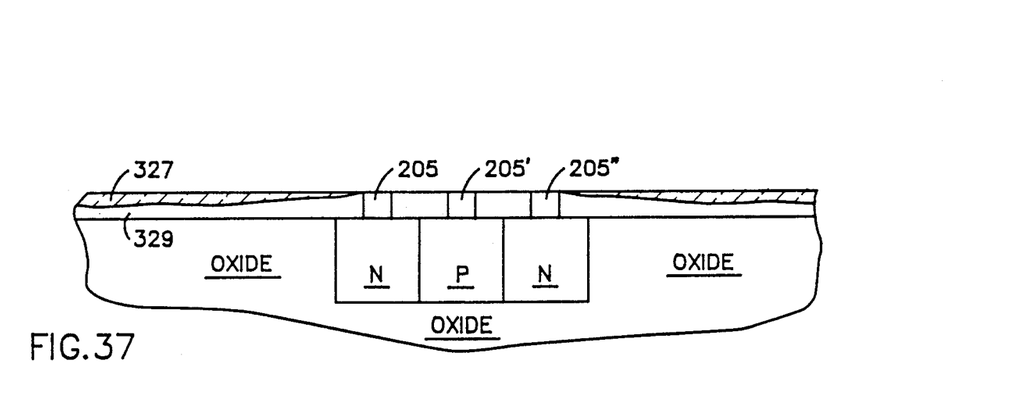
FIG. 37 shows the structure of FIG. 36 with the nitride buttons removed.

In FIG. 37, the nitride buttons 211, 212 and 213 have been removed from the contacts 205, 205' and 205" using a conventional step to prepare the contacts for doping to make them properly conductive.

Figure 38:
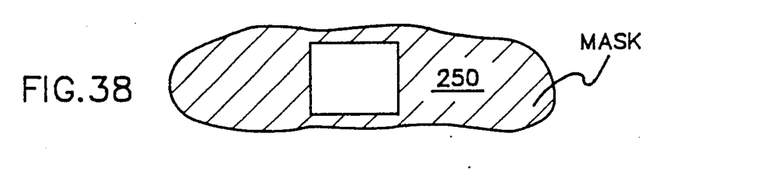
FIG. 38 shows the mask to be used in making a doping opening to the base contact.
Figure 39:
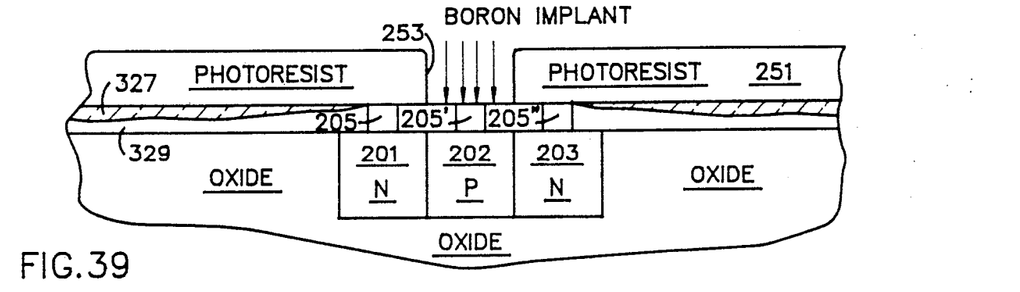
FIG. 39 shows the doping step for the base contact.

In FIG. 38, mask 250 is shown for delineating photoresist 251, in the previous manner, to provide the opening 253 for the boron implant, as shown by the arrows in FIG. 39.

Figure 39A:
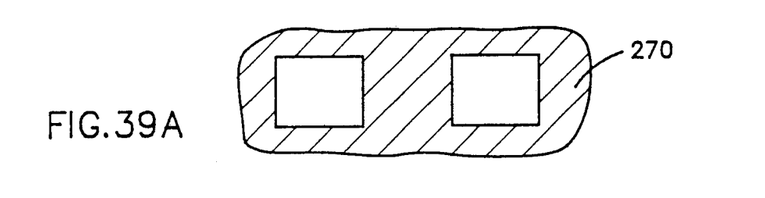
FIG. 39A shows a mask for making openings to the collector and emitter contacts.
Figure 40:
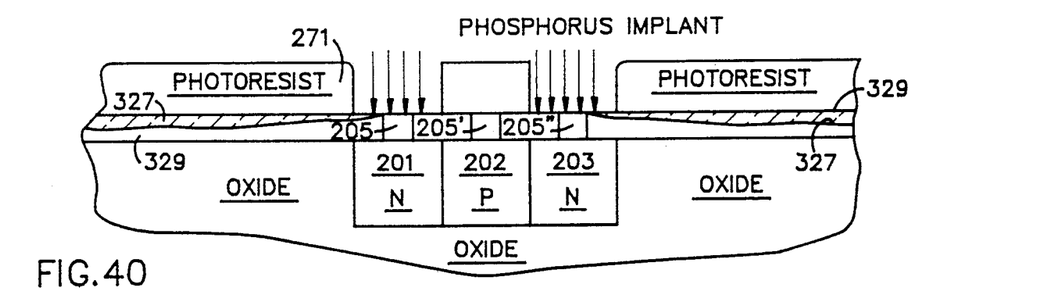
FIG. 40 shows the doping step for the collector and emitter contacts.

In similar fashion, mask 270 of FIG. 39A, is again utilized to delineate the photoresist 271 for the phosphorus implants, shown by the arrows (FIG. 40), thereby concluding the doping of the three polysilicon contacts 205, 205' and 205" in the same N or P doping as their underlying collector, base and emitter.

Figure 41:
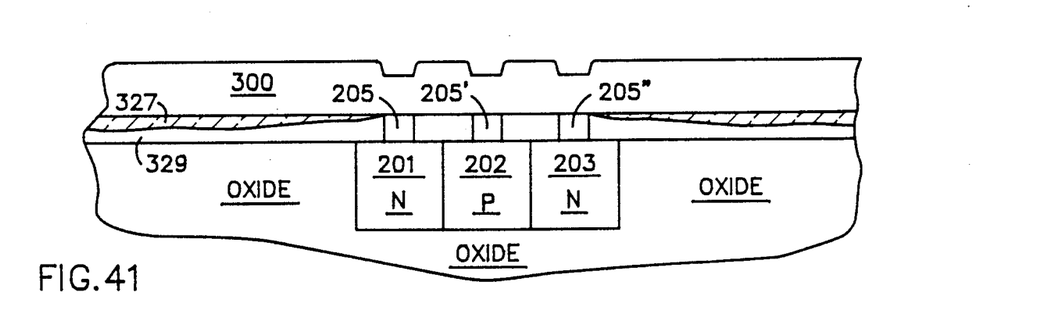
FIG. 41 includes the metal interconnect layer.
Figure 42:
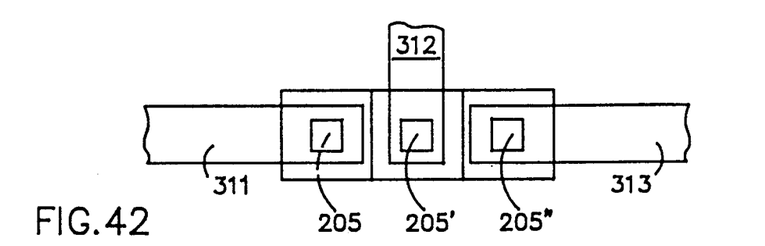
FIG. 42 shows the delineated metal interconnects.
Figure 43:
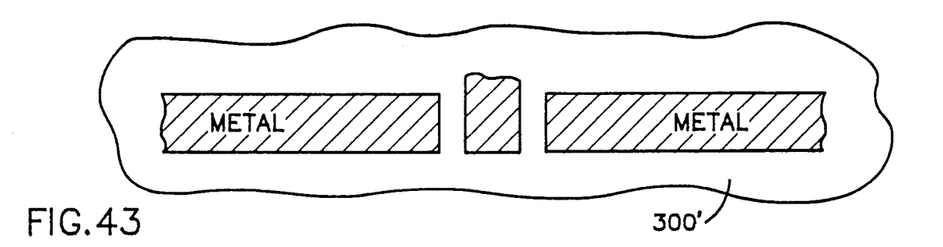
FIG. 43 shows the mask for effecting the delineation.

In FIG. 41, the metal layer 300 has been applied over this structure, and the metal mask of FIG. 43, shown at 300', is used and the metal is etched to provide the metal interconnects 311 (FIG. 42) to the doped poly electrode 205 of collector 201, interconnect 312 to the doped poly electrode 205' of the base 202 and interconnect 313 to the doped poly electrode 205" of emitter 203.

Figure 44:
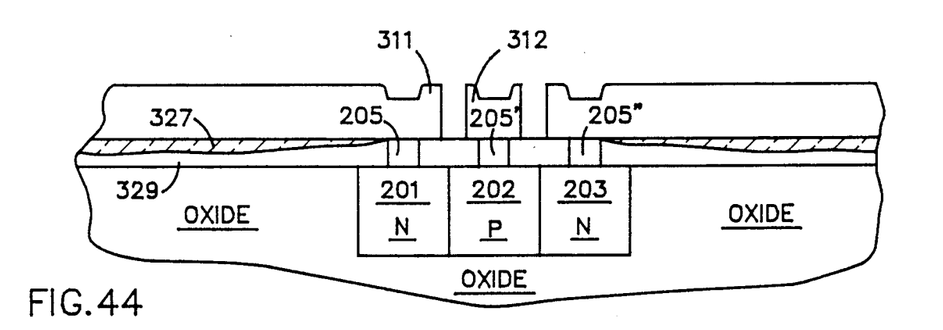
FIG. 44 shows the completed device.

FIG. 44 shows the completed device made in this fashion.

Figure 45:
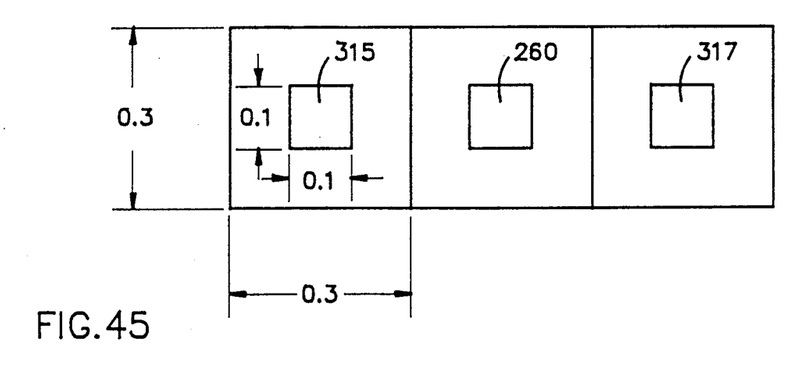
FIG. 45 is an example of relative sizes available from this method.

Finally, FIG. 45 shows, by way of example, relative sizes for the bipolar device, the elements themselves such as the collector measuring 0.3 by 0.3 microns and the contact regions measuring 0.1 by 0.1 microns.

The use of an E-beam fabricator, guided by the masks successively used herein, makes the VLSI contacts of the order of these dimensions. Of course, larger contacts might be readily utilized. This technique is accomplished through the use of polysilicon which remains in the electrode areas, but is converted to polyoxide in the remaining areas with the nitride buttons having guarded against oxidation of the polysilicon electrode areas.

If desired, single MOS or bipolar devices may be made, and it is only necessary to insulate them by isolation, usually in lieu of the field oxide, illustrated.

This method is also applicable to MOS, GaAs and conventional bipolar minimal size contacts obtained down to 0.1×0.1 microns, or to 0.1 micron diameter where the spot size is 0.1 micron.

In summary, the following advantages are achieved by this alternate method:

1. Sub-micron contact technology.
2. Contact integrity without the need of excessive silicon content in the metal or contact barriers such as Titanium Nitride, etc.
3. Planar structures without severe steps to hinder metal step coverage, or restrictions for proximity of contact to vias to gates, thereby improving packing density.
4. Principle applicable to MOS (NMOS, PMOS, CMOS, etc.), Bipolar devices and GaAs technologies.
5. Contact technology compatible with shallow junctions and other state of the art processes such as selective silicides.
6. Minimum overlap of metal for interconnects.
7. Via overlap of contact realizable with this technique.

I claim:

1. An array of sub-micron dimensioned PNP-type lateral transistors formed in a substrate doped N-type, each comprising in combination:
    spaced apart slots in the substrate through selected sides of which N+-type doping is received into the adjacent substrate and driven in followed by P or P+ doping driven in through opposed sides;
    said spaced apart slots comprising spaced apart pairs of slots orthogonally related to further pairs of slots with each pair of slots and each further pair of slots bounding a portion of the substrate comprising a region between said opposed sides;
    said slots filled with field oxide and surrounding each said region where a transistor will be formed;
    said P+ doping on the inner sides of said spaced apart slots within said regions comprising an emitter and a collector electrode area;
    said N+ doping and the N substrate in said region between the P+ doping comprising a graded base electrode area;
    electrical contacts on each P+ electrode area and on the graded N+N electrode area; and,
    each contact measuring down to 0.1 micron across.

2. The transistor of claim 1, wherein:
    said region is substantially rectangular having a length of $5d$ and a width of $3d$ wherein d is 0.4 to 1 micrometer.

3. The transistor of claim 1 wherein said region is isolated by substrate oxidation from the substrate.

4. A sub-micron dimensioned PNP-type lateral transistor formed in a N-type substrate, comprising in combination:
    a transistor region isolated from the substrate by substrate oxide filling orthogonally related slots around the region and completely underlying the region;
    said region comprising an emitter P electrode, a graded base N+N electrode, and a collector P electrode;
    said region doped from a first side through a first slot prior to filling said slot with oxide by N+ doping driven in followed by P doping driven in;
    said region doped from a side opposite said first side by P doping driven in; and,
    an electrical contact on each P electrode and on the graded base N+N electrode measuring down to 0.1 micron across each contact.

5. The transistor of claim 4, wherein:
    the N+ doping is supplied by one of phosphorus and arsenic ions angle implanted relative to said first side and the P doping is supplied by boron angle implanted through said first side and said opposite side.

* * * * *